(12) United States Patent
Takahashi

(10) Patent No.: US 12,733,455 B2
(45) Date of Patent: Sep. 8, 2026

(54) INSPECTION DEVICE, MOUNTING APPARATUS, INSPECTION METHOD, AND NON-TRANSITORY COMPUTER READABLE RECORDING MEDIUM

(71) Applicant: Yamaha Robotics Co., Ltd., Tokyo (JP)

(72) Inventor: Makoto Takahashi, Tokyo (JP)

(73) Assignee: Yamaha Robotics Co., Ltd., Tokyo (JP)

( * ) Notice: Subject to any disclaimer, the term of this patent is extended or adjusted under 35 U.S.C. 154(b) by 407 days.

(21) Appl. No.: 18/271,845

(22) PCT Filed: Feb. 15, 2022

(86) PCT No.: PCT/JP2022/005883

§ 371 (c)(1),
(2) Date: Jul. 11, 2023

(87) PCT Pub. No.: WO2023/157061

PCT Pub. Date: Aug. 24, 2023

(65) Prior Publication Data

US 2024/0404890 A1 Dec. 5, 2024

(51) Int. Cl.
*H10P 74/20* (2026.01)
*H05K 1/02* (2006.01)
(Continued)

(52) U.S. Cl.
CPC ......... *H10P 74/203* (2026.01); *H05K 1/0269* (2013.01); *H05K 3/303* (2013.01);
(Continued)

(58) Field of Classification Search
CPC ......... H01L 22/12; H01L 21/50; H01L 21/52; H01L 21/67; H01L 21/67259;
(Continued)

(56) References Cited

U.S. PATENT DOCUMENTS 6,055,049 A 4/2000 Mueller
7,890,203 B2 * 2/2011 Akagawa ............. H05K 1/0269 700/121

(Continued)

FOREIGN PATENT DOCUMENTS

JP 2002524884 8/2002
JP 2003051700 2/2003

(Continued)

OTHER PUBLICATIONS

JP-4326641-B2, English Translation (Year: 2009).*

(Continued)

*Primary Examiner* — Ryan D Walsh
(74) *Attorney, Agent, or Firm* — JCIPRNET

(57) ABSTRACT

An inspection device includes: a measurement part, measuring a reference position of a mounting section before mounting of a semiconductor chip, a reference position of a plurality of peripheral sections located around the mounting section, and a position of the semiconductor chip after mounting; and an inspection part, inspecting a relative position of the semiconductor chip with respect to the mounting section based on a distance between the reference position of the mounting section and the reference position of the plurality of peripheral sections measured by the measurement part and a distance between the reference position of the plurality of peripheral sections and a mounting position of the semiconductor chip after mounting of the semiconductor chip.

6 Claims, 5 Drawing Sheets

(51) Int. Cl.

| | |
|---|---|
| ***H05K 3/303*** | (2026.01) |
| ***H05K 13/00*** | (2006.01) |
| ***H05K 13/04*** | (2006.01) |
| ***H05K 13/08*** | (2006.01) |
| ***H10P 72/00*** | (2026.01) |
| ***H10P 72/50*** | (2026.01) |
| ***H10P 74/00*** | (2026.01) |
| ***H10W 72/00*** | (2026.01) |
| ***H10W 95/00*** | (2026.01) |

(52) U.S. Cl.
CPC ......... *H05K 13/0015* (2013.01); *H05K 13/04* (2013.01); *H05K 13/0812* (2018.08); *H05K 13/0815* (2018.08); *H10P 72/00* (2026.01); *H10P 72/0606* (2026.01); *H10P 72/50* (2026.01); *H10P 74/277* (2026.01); *H10W 72/071* (2026.01); *H10W 95/00* (2026.01); *H05K 2203/166* (2013.01)

(58) Field of Classification Search
CPC ....... H01L 21/68; H01L 22/34; H05K 1/0269; H05K 3/303; H05K 13/0015; H05K 13/04; H05K 13/0812; H05K 13/0815; H05K 2203/166
See application file for complete search history.

(56) References Cited

U.S. PATENT DOCUMENTS

| | | | | |
|---|---|---|---|---|
| 9,431,365 | B2 | 8/2016 | Seok et al. | |
| 2018/0177087 | A1* | 6/2018 | Kito ................... | H05K 13/0813 |
| 2019/0380235 | A1* | 12/2019 | Sakurayama ...... | H05K 13/0015 |
| 2023/0163096 | A1 | 5/2023 | Terada et al. | |

FOREIGN PATENT DOCUMENTS

| | | | | |
|---|---|---|---|---|
| JP | 4326641 B2 * | 9/2009 | ......... | H05K 13/0812 |
| JP | 2016063230 | 4/2016 | | |
| JP | 2021027171 | 2/2021 | | |
| KR | 20220002113 | 1/2022 | | |
| WO | WO-2004021760 A1 * | 3/2004 | ............. | H05K 13/08 |
| WO | 2006118018 | 11/2006 | | |
| WO | 2022014451 | 1/2022 | | |

OTHER PUBLICATIONS

WO-2004021760-A1, English Translation (Year: 2004).*
"Office Action of Korea Counterpart Application", issued on Sep. 27, 2024, with English translation thereof, p. 1-p. 14.
"International Search Report (Form PCT/ISA/210) of PCT/JP2022/005883", mailed on May 24, 2022, pp. 1-3.
"The First Office Action of China Counterpart Application", with English translation thereof, issued on Jul. 18, 2026, pp. 1-15.

* cited by examiner

INSPECTION DEVICE, MOUNTING APPARATUS, INSPECTION METHOD, AND NON-TRANSITORY COMPUTER READABLE RECORDING MEDIUM

CROSS-REFERENCE TO RELATED APPLICATION

This application is a 371 application of the International PCT application serial no. PCT/JP2022/005883, filed on Feb. 15, 2022. The entirety of the above-mentioned patent application is hereby incorporated by reference herein and made a part of this specification.

TECHNICAL FIELD

The present invention relates to an inspection device, a mounting apparatus, an inspection method, and a program.

RELATED ART

Conventionally, there has been known a technique for inspecting a mounting position of a semiconductor chip with respect to a substrate. For example, in a technique described in Patent Document 1, based on a positional relationship between an alignment mark of a semiconductor chip and a corner of the semiconductor chip that is recognized by image processing, it is inspected whether a mounting position of the semiconductor chip is within a desired range.

PRIOR-ART DOCUMENTS

Patent Documents

Patent Document 1: WO 06-118018

SUMMARY OF THE INVENTION

Problems to be Solved by the Invention

However, in the technique described in Patent Document 1, since an edge of the semiconductor chip is not always vertical, it may be difficult to accurately recognize the corner of the semiconductor chip by image processing, and there is still room for improvement from the viewpoint of accurately inspecting the mounting position of the semiconductor chip with reference to the corner of the semiconductor chip.

The present invention has been made to solve such a problem, and provides an inspection device, a mounting apparatus, an inspection method, and a program, in which a mounting position of a semiconductor chip can be accurately inspected.

Means for Solving the Problems

An inspection device according to one aspect of the present invention includes: a measurement part, measuring a reference position of a mounting section before mounting of a semiconductor chip, a reference position of a plurality of peripheral sections located around the mounting section, and a position of the semiconductor chip after mounting; and an inspection part, based on a distance between the reference position of the mounting section and the reference position of the plurality of peripheral sections measured by the measurement part and a distance between the reference position of the plurality of peripheral sections and a mounting position of the semiconductor chip after mounting of the semiconductor chip, inspecting a relative position of the semiconductor chip with respect to the mounting section.

An inspection method according to one aspect of the present invention includes steps of: measuring a reference position of a mounting section before mounting of a semiconductor chip; measuring a reference position of a plurality of peripheral sections located around the mounting section; measuring a position of the semiconductor chip after mounting; and, based on a distance between the reference position of the mounting section and the reference position of the plurality of peripheral sections and a distance between the reference position of the plurality of peripheral sections and a mounting position of the semiconductor chip after mounting of the semiconductor chip, inspecting a relative position of the semiconductor chip with respect to the mounting section.

A program according to one aspect of the present invention causes a computer to execute: processing for measuring a reference position of a mounting section before mounting of a semiconductor chip; processing for measuring a reference position of a plurality of peripheral sections located around the mounting section; processing for measuring a position of the semiconductor chip after mounting; and processing for, based on a distance between the reference position of the mounting section and the reference position of the plurality of peripheral sections and a distance between the reference position of the plurality of peripheral sections and a mounting position of the semiconductor chip after mounting of the semiconductor chip, inspecting a relative position of the semiconductor chip with respect to the mounting section.

Effects of the Invention

According to the present invention, a mounting position of a semiconductor chip can be accurately inspected.

DESCRIPTION OF THE EMBODIMENTS

A configuration of a bonding apparatus according to the present embodiment is described below.

Figure 1:
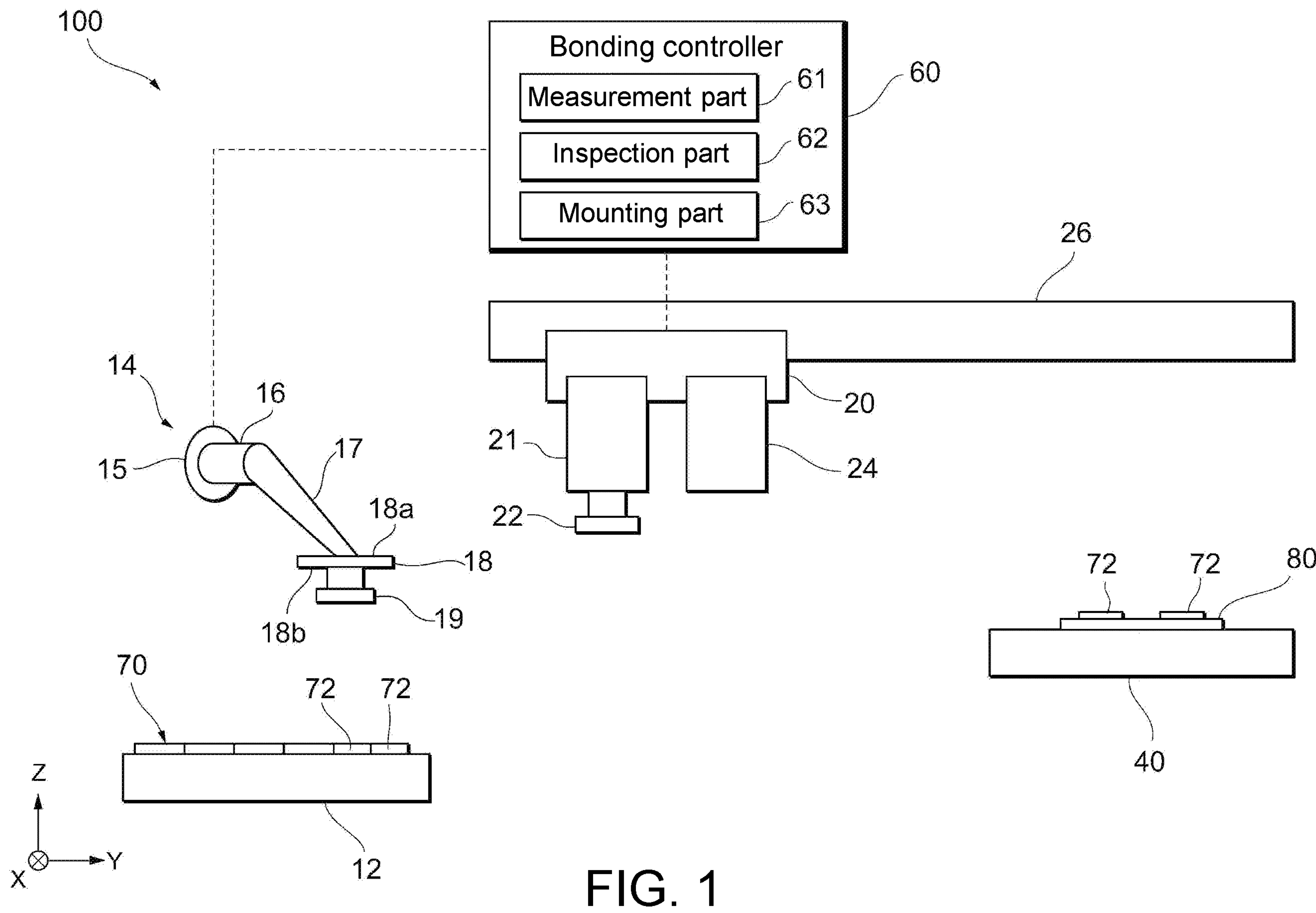
FIG. 1 is a side view showing a schematic configuration of a bonding apparatus according to the present embodiment.

As shown in FIG. 1, a bonding apparatus 100 includes a wafer holder 12, a handling unit 14, a bonding head 20, an XY table 26, a bonding stage 40, and a bonding controller 60. In the following description, a direction parallel to a bonding target surface is defined as an XY-axis direction, and a direction perpendicular to the bonding target surface is defined as a Z-axis direction.

The bonding apparatus 100 is an example of a mounting apparatus for mounting a semiconductor chip 72 (also referred to as "die") of a wafer 70 on a substrate 80. An integrated circuit pattern is formed on a surface of the semiconductor chip 72. In the bonding apparatus 100, the semiconductor chip 72 is aligned with the substrate 80, and the semiconductor chip 72 is bonded to the substrate 80 so that a back surface of the semiconductor chip 72 faces the substrate 80. The bonding apparatus 100 like this is called a flip chip bonder or a die bonding apparatus.

The wafer holder 12 holds the wafer 70. The wafer 70 includes a plurality of semiconductor chips 72 diced in a grid pattern. The wafer holder 12 holds the plurality of semiconductor chips 72 by, for example, vacuum sucking the wafer 70. The wafer holder 12 may hold the plurality of semiconductor chips 72 by, for example, sticking the wafer 70 on a film.

The handling unit 14 includes, for example, a stepping motor 15, a rotary shaft 16, an arm 17, a base 18, and a pickup tool 19. The stepping motor 15 rotates the rotary shaft 16 to invert the base 18 and the pickup tool 19. The arm 17 has one end attached to the rotary shaft 16 and extending obliquely downward in the Z-axis direction from the rotary shaft 16, and has the other end attached to an upper surface 18*a* of the base 18 in the Z-axis direction. The base 18 is fixed to a tip of the arm 17 with a bolt or the like. The pickup tool 19 is attached to a lower surface 18*b* of the base 18 in the Z-axis direction. The pickup tool 19 is configured to be movable in the Z-axis direction.

The handling unit 14 is moved to above the wafer holder 12 with the pickup tool 19 directed downward. The handling unit 14 sucks the semiconductor chip 72 from above by the pickup tool 19. On the other hand, the stepping motor 15 rotates the rotary shaft 16 and inverts the base 18 and the pickup tool 19, thereby causing the lower surface 18*b* of the base 18 to face upward in the Z-axis direction and the pickup tool 19 to face upward. Accordingly, the handling unit 14 inverts the semiconductor chip 72 that has been picked up.

The bonding head 20 sucks the semiconductor chip 72 picked up from the wafer holder 12 and conveys it to a position of the substrate 80, and bonds the semiconductor chip 72 to the substrate 80.

A bonding tool 22 is attached to the bonding head 20 via a Z-axis drive mechanism 21. A camera 24 is attached to the bonding head 20. The bonding head 20 is configured to be movable in the X-axis direction and the Y-axis direction by the XY table 26. The bonding tool 22 and the camera 24 are configured to be movable in the X-axis direction and the Y-axis direction together with the bonding head 20.

The bonding tool 22 is configured in, for example, a rectangular parallelepiped shape or a truncated cone shape, and holds the surface of the semiconductor chip 72 on which the integrated circuit pattern is formed. The bonding tool 22 has a central axis parallel to the Z-axis direction, and is configured to be movable in each of the Z-axis direction, the X-axis direction, and the Y-axis direction by the Z-axis drive mechanism 21 and the XY table 26.

The bonding tool 22 is attached to the bonding head 20 via a θ-axis drive mechanism and a tilt drive mechanism (both not shown), and is configured to be rotatable around the Z-axis and movable in a tilt direction (inclination direction) by these drive mechanisms.

The camera 24 is configured to include, for example, an optical system such as a lens, and an imaging element such as a charge coupled device (CCD) image sensor, a complementary metal oxide semiconductor (CMOS) image sensor or the like. The camera 24 has, for example, an optical axis along a vertical direction, and photographs an upper surface of the bonding stage 40 in the case of being located above the bonding stage 40.

The bonding stage 40 is a stage for bonding the semiconductor chip 72 to the substrate 80. The bonding stage 40 includes a moving mechanism that moves the substrate 80 in the X-axis direction and the Y-axis direction, and a heating mechanism that heats the substrate 80.

The bonding controller 60 is realized, for example, by a hardware processor such as a central processing unit (CPU) executing a program (software). Some or all of these components may be realized by hardware (including circuitry) such as large scale integration (LSI), an application specific integrated circuit (ASIC), a field-programmable gate array (FPGA) or a graphics processing unit (GPU), or may be realized by cooperation between software and hardware. The program may be stored in advance in a storage device such as an HDD or a flash memory of the bonding controller 60, or may be stored in a removable storage medium such as a DVD or a CD-ROM and installed in an HDD or a flash memory of the bonding controller 60 by attachment of the storage medium to a drive device.

The bonding controller 60 includes, for example, a measurement part 61, an inspection part 62, and a mounting part 63.

The measurement part 61 measures a reference position of the substrate 80 based on image data of the substrate 80 photographed by the camera 24. For example, the measurement part 61 identifies a position of a feature point of the substrate 80 by performing image recognition processing on the image data of the substrate 80 photographed by the camera 24, and measures the reference position of the substrate 80 based on the identified position of the feature point. The substrate 80 includes a mounting section in which the semiconductor chip 72 is to be mounted, and a peripheral section located around the mounting section. The mounting section and the peripheral section may also be substrates on which the semiconductor chip 72 formed on a wafer is mounted. Furthermore, the peripheral section may include a section before the semiconductor chip 72 is mounted and a section after the semiconductor chip 72 is mounted.

The measurement part 61 measures a mounting position of the semiconductor chip 72 based on image data of the semiconductor chip 72 mounted on the substrate 80 photographed by the camera 24. For example, the measurement part 61 identifies a position of a feature point of the semiconductor chip 72 by performing image recognition processing on the image data of the semiconductor chip 72 photographed by the camera 24, and identifies the mounting position of the semiconductor chip 72 based on the identified position of the feature point. The feature point of the semiconductor chip 72 is a feature point exposed on a surface opposite to a mounting surface of the semiconductor chip 72 after mounting, and includes, for example, an end of an electrode penetrating through the semiconductor chip 72 in a thickness direction.

The inspection part 62 calculates a distance between a reference position of the mounting section and a reference position of a plurality of peripheral sections measured by the measurement part 61. The inspection part 62 calculates a distance between the plurality of peripheral sections and the mounting position of the semiconductor chip 72 after mounting of the semiconductor chip 72. Based on the distance between the reference position of the mounting section and the reference position of the plurality of peripheral sections measured by the measurement part 61 and the distance between the reference position of the plurality of peripheral sections and the mounting position of the semiconductor chip 72 after mounting of the semiconductor chip 72, the inspection part 62 inspects a relative position of the semiconductor chip 72 with respect to the mounting section.

Based on the relative position of the semiconductor chip 72 with respect to the mounting section that is inspected by the inspection part 62, the mounting part 63 mounts the semiconductor chip 72 with respect to the mounting section. For example, based on the amount of deviation of the relative position of the semiconductor chip 72 inspected by the inspection part 62 from a target position, the mounting part 63 corrects the mounting position of the semiconductor chip 72 with respect to the mounting section.

An inspection method executed by the bonding apparatus 100 according to the present embodiment includes: a step (first step) of measuring a reference position of a mounting section before mounting of the semiconductor chip 72; a step (second step) of measuring a reference position of a plurality of peripheral sections located around the mounting section; a step (third step) of measuring a position of the semiconductor chip 72 after mounting; and a step (fourth step) of, based on a distance between the reference position of the mounting section and the reference position of the plurality of peripheral sections and a distance between the reference position of the plurality of peripheral sections and the mounting position of the semiconductor chip 72 after mounting of the semiconductor chip 72, inspecting a relative position of the semiconductor chip 72 with respect to the mounting section.

Figure 2:
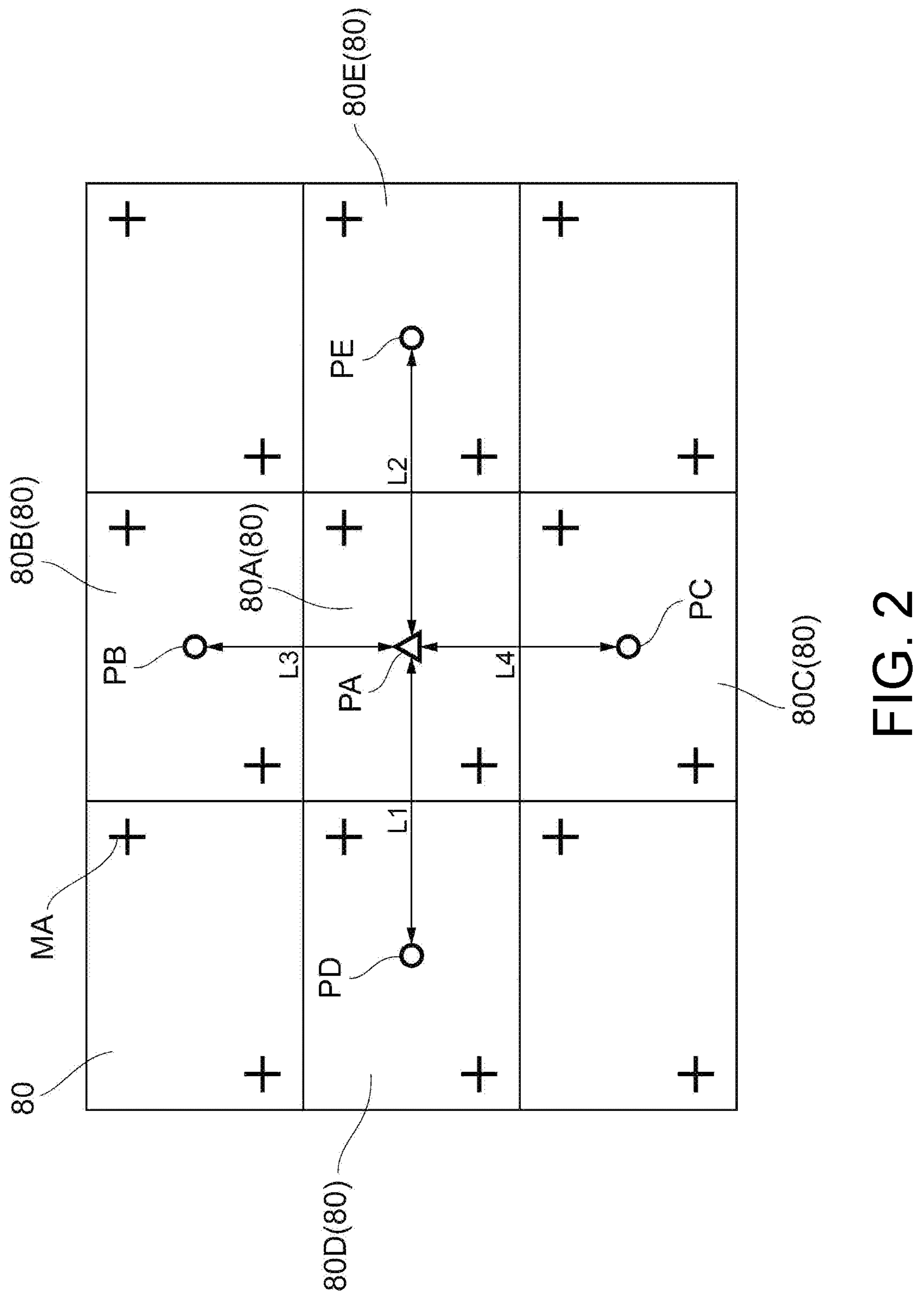
FIG. 2 is a diagram showing a positional relationship between a mounting section and a peripheral section.

FIG. 2 shows an example of a state before mounting of the semiconductor chip 72, and is a diagram for describing the first step and the second step mentioned above. In the example shown in FIG. 2, a plurality of substrates 80 are arranged in parallel in a vertical direction (first direction) and a horizontal direction (second direction). Among these substrates 80, the substrate 80 located in the center is set as a mounting section 80A. The substrates 80 adjacent to the mounting section 80A on both sides in the vertical direction are set as a first peripheral section 80B and a second peripheral section 80C. The substrates 80 adjacent to the mounting section 80A on both sides in the horizontal direction are set as a third peripheral section 80D and a fourth peripheral section 80E. A feature point of the substrate 80 includes, for example, an alignment mark MA indicating a position of the substrate 80. The alignment mark MA is provided in the vicinity of two diagonally located corners of an upper surface of the substrate 80. For example, based on position information of two feature points of the substrate 80, the measurement part 61 measures an intermediate position between the two feature points as the reference position of the substrate 80.

The inspection part 62 calculates a distance L3 between a reference position PA of the mounting section 80A and a reference position PB of the first peripheral section 80B, a distance L4 between the reference position PA of the mounting section 80A and a reference position PC of the second peripheral section 80C, a distance L1 between the reference position PA of the mounting section 80A and a reference position PD of the third peripheral section 80D, and a distance L2 between the reference position PA of the mounting section 80A and a reference position PE of the fourth peripheral section 80E.

Figure 3:
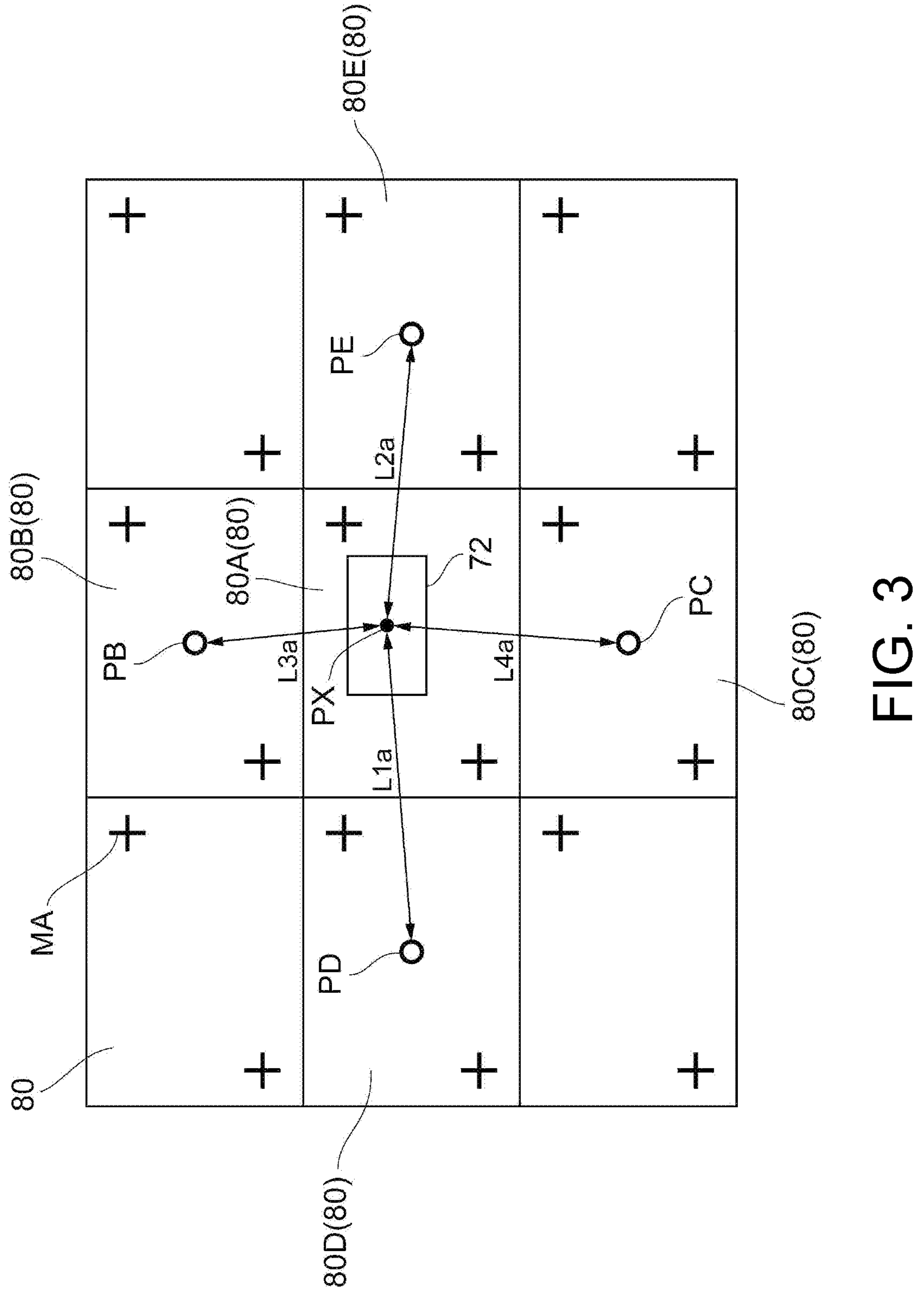
FIG. 3 is a diagram showing a positional relationship between a semiconductor chip and a peripheral section.

FIG. 3 shows an example of a state after mounting of the semiconductor chip 72, and is a diagram for describing the third step and the fourth step mentioned above:

In the example shown in FIG. 3, the inspection part 62 calculates a distance L3*a* between a mounting position PX of the semiconductor chip 72 and the reference position PB of the first peripheral section 80B, a distance L4*a* between the mounting position PX of the semiconductor chip 72 and the reference position PC of the second peripheral section 80C, a distance L1*a* between the mounting position PX of the semiconductor chip 72 and the reference position PD of the third peripheral section 80D, and a distance L2*a* between the mounting position PX of the semiconductor chip 72 and the reference position PE of the fourth peripheral section 80E.

For example, based on the distances L3, L4, L1, and L2 between the reference position PA of the mounting section 80A and the reference positions PB to PE of the plurality of peripheral sections 80B to 80E before mounting of the semiconductor chip 72, the inspection part 62 identifies relative positions of the mounting section 80A and the peripheral sections 80B to 80E. Based on the distances L3*a*, L4*a*, L1*a*, and L2*a* between the reference positions PB to PE of the plurality of peripheral sections 80B to 80E and the mounting position PX of the semiconductor chip 72 after mounting of the semiconductor chip 72, the inspection part 62 identifies relative positions of the semiconductor chip 72 and the peripheral sections 80B to 80E. Based on the relative positions of the mounting section 80A and the peripheral sections 80B to 80E and the relative positions of the semiconductor chip 72 and the peripheral sections 80B to 80E after mounting of the semiconductor chip 72, the inspection part 62 inspects the relative position of the semiconductor chip 72 with respect to the mounting section 80A.

Next, processing for mounting the semiconductor chip 72 that is executed by the bonding apparatus 100 according to the present embodiment is described.

Figure 4:
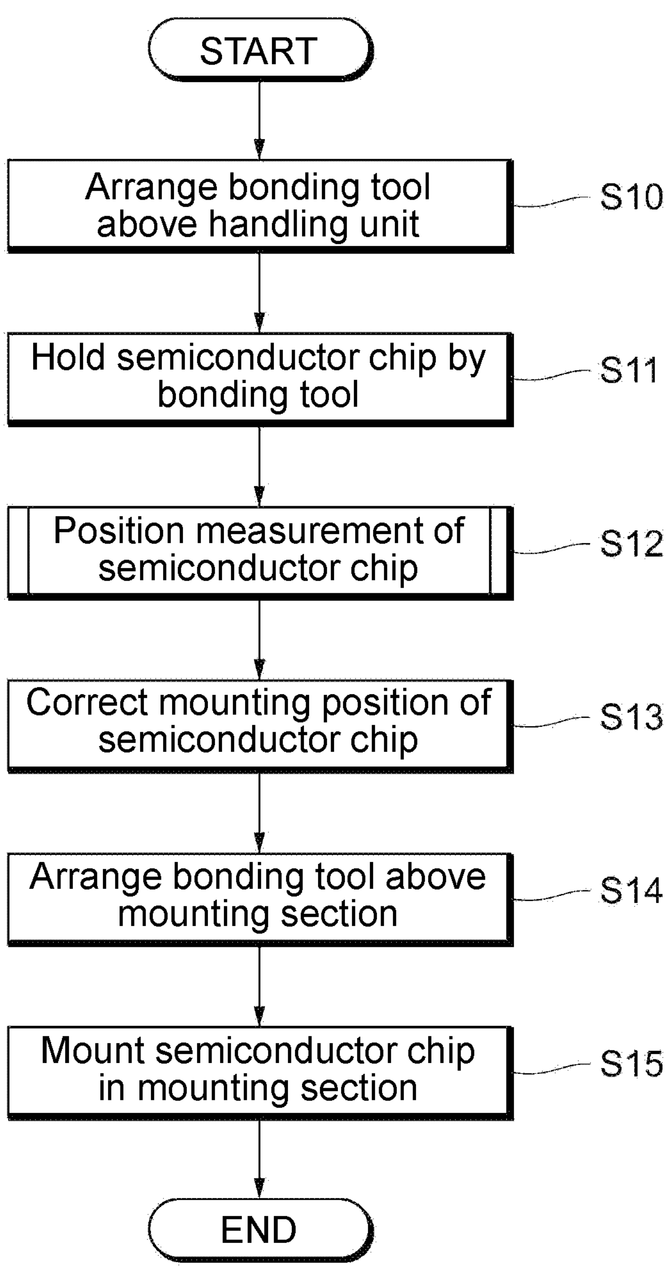
FIG. 4 is a flowchart showing a processing flow of processing for mounting a semiconductor chip.

As shown in FIG. 4, first, the bonding controller 60 moves the bonding head 20 and arranges the bonding tool 22 above the handling unit 14 (S10).

Next, the bonding controller 60 drives the Z-axis drive mechanism 21 to lower the bonding tool 22 and hold the semiconductor chip 72 at a tip of the bonding tool 22 (S11).

Next, the bonding controller 60 drives the Z-axis drive mechanism 21 to lift the bonding tool 22 to a preset height, and then moves the bonding head 20 to arrange the camera 24 above the bonding stage 40. Then, the bonding controller 60 executes processing for position measurement of the semiconductor chip 72 (S12).

Figure 5:
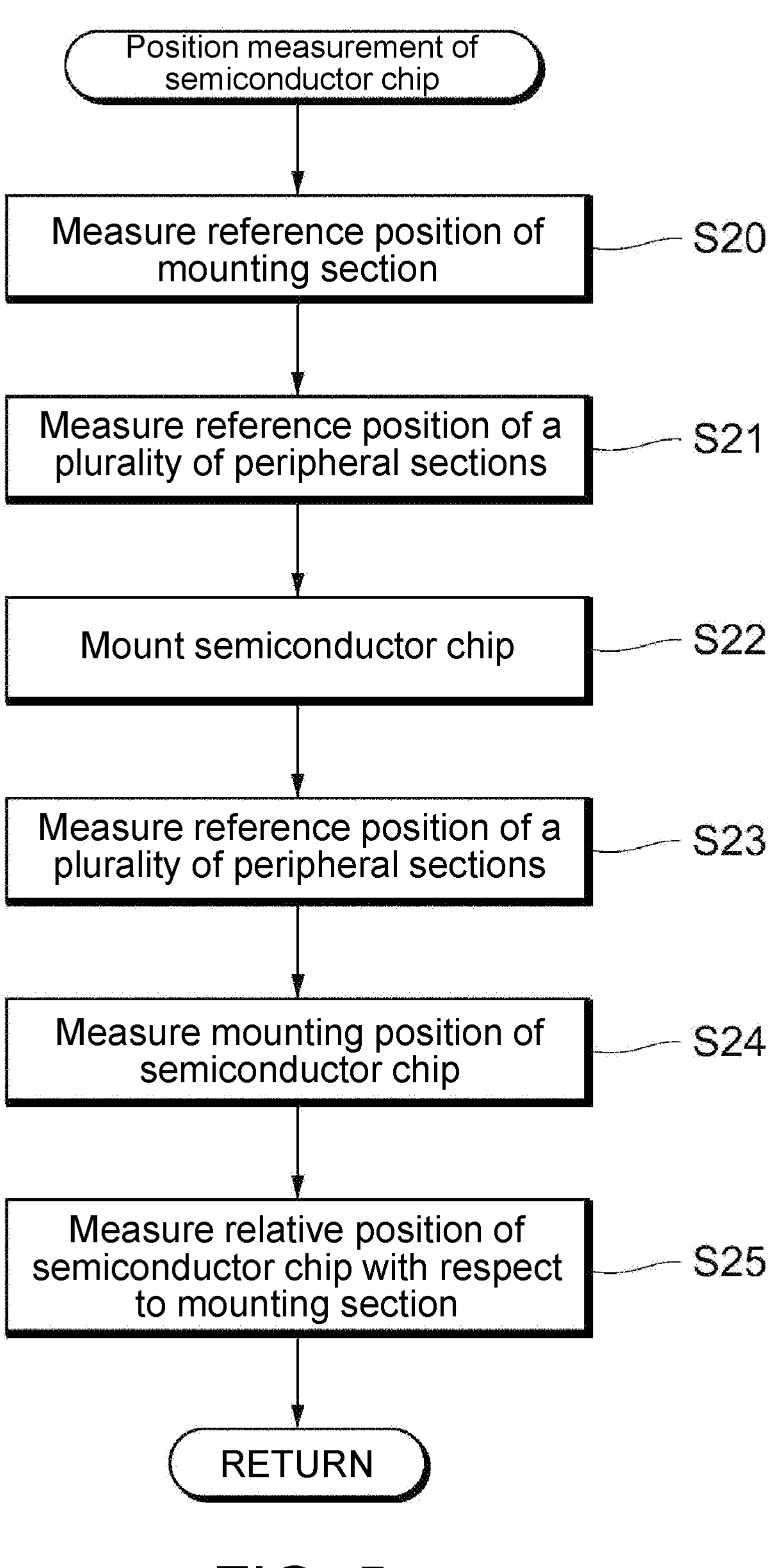
FIG. 5 is a flowchart showing a processing flow of position measurement of a semiconductor chip.

As shown in FIG. 5, in the processing for position measurement of the semiconductor chip 72, first, the bonding controller 60 measures a reference position of the mounting section 80A based on image data of the mounting section 80A photographed by the camera 24 (S20).

Next, the bonding controller 60 measures the reference positions PB to PE of the plurality of peripheral sections 80B to 80E based on image data of the peripheral sections 80B to 80E photographed by the camera 24 (S21).

Next, by driving the bonding tool 22, the bonding controller 60 mounts the semiconductor chip 72 with respect to the mounting section 80A on the bonding stage 40 (S22).

Next, the bonding controller 60 measures the reference positions PB to PE of the plurality of peripheral sections 80B to 80E based on the image data of the peripheral sections 80B to 80E photographed by the camera 24 (S23).

Next, the bonding controller 60 measures a position of the semiconductor chip 72 after mounting based on image data of the semiconductor chip 72 photographed by the camera 24 (S24).

Next, based on the distances L1 to L4 between the reference position PA of the mounting section 80A measured in the previous step S20 and the reference positions PB to PE of the plurality of peripheral sections 80B to 80E measured in the previous step S21 as well as the distances L1*a* to L4*a* between the reference positions PB to PE of the plurality of peripheral sections 80B to 80E measured in the previous step S23 and the mounting position PX of the semiconductor chip 72 after mounting measured in the previous step S24, the bonding controller 60 measures a relative position of the semiconductor chip 72 with respect to the mounting section 80A (S25).

Next, referring back to FIG. 4, based on the relative position of the semiconductor chip 72 with respect to the mounting section 80A measured in the previous step S25, the bonding controller 60 corrects a mounting position of the semiconductor chip 72 (S13).

Next, the bonding controller 60 moves the bonding head 20 and arranges the bonding tool 22 above the mounting section 80A (S14).

Next, the bonding controller 60 lowers the bonding tool 22 to the vicinity of the mounting section 80A, and mounts the semiconductor chip 72 in the mounting section 80A (S15).

Next, effects of the bonding apparatus 100 according to the present embodiment are described.

When the semiconductor chip 72 is mounted with respect to the mounting section 80A, if a surface of the semiconductor chip 72 facing the mounting section 80A is provided with the alignment mark MA, it is difficult to photograph the alignment mark MA of the semiconductor chip 72 with a visible light camera. In particular, if a material non-transmissive to infrared light is interposed between the mounting section 80A and the semiconductor chip 72, even if an infrared camera is used, it is difficult to photograph the alignment mark MA of the semiconductor chip 72.

In this respect, in the bonding apparatus 100 according to the present embodiment, when the semiconductor chip 72 is mounted with respect to the mounting section 80A, a feature point on a surface of the semiconductor chip 72 opposite to the surface facing the mounting section 80A is photographed by the camera 24, and a position of the feature point is measured as the mounting position PX of the semiconductor chip 72.

Here, a positional relationship between the mounting section 80A and the peripheral sections 80B to 80E does not change between before and after mounting of the semiconductor chip 72. Hence, in the bonding apparatus 100, by using a positional relationship between the reference position PA of the mounting section 80A and the reference positions PB to PE of the peripheral sections 80B to 80E before mounting of the semiconductor chip 72 as a reference, it is possible to measure the relative position of the semiconductor chip 72 with respect to the mounting section 80A with reference to a positional relationship between the mounting position PX of the semiconductor chip 72 and the reference positions PB to PE of the plurality of peripheral sections 80B to 80E. Accordingly, the mounting position of the semiconductor chip 72 can be accurately inspected.

The above embodiment can also be implemented in the following forms.

In the above embodiment, the plurality of peripheral sections 80B to 80E are defined as follows. The substrates 80 adjacent to the mounting section 80A on both sides in the vertical direction and the substrates 80 adjacent to the mounting section 80A on both sides in the horizontal direction are defined as the peripheral sections 80B to 80E. Alternatively, the plurality of peripheral sections are not necessarily the substrates 80 adjacent in the vertical direction or horizontal direction if they are substrates 80 located around the mounting section 80A. The number of peripheral sections does not necessarily have to be four and may be two or more.

In the above embodiment, the relative position of the semiconductor chip 72 with respect to the mounting section 80A is inspected each time the semiconductor chip 72 is mounted with respect to one mounting section 80A. Alternatively, the relative position of the semiconductor chip 72 with respect to a plurality of mounting sections 80A may be inspected in parallel after processing for mounting the semiconductor chip 72 with respect to these mounting sections 80A has been performed.

In the above embodiment, each time the relative position of the semiconductor chip 72 with respect to the mounting section 80A is inspected, the mounting position of the semiconductor chip 72 with respect to the mounting section 80A is corrected based on the relative position of the semiconductor chip 72 with respect to the mounting section 80A. Alternatively, in the case where there are a plurality of mounting sections 80A in which the semiconductor chip 72 is to be mounted, a condition for correcting the mounting position of the semiconductor chip 72 based on the relative position of the semiconductor chip 72 with respect to some of the mounting sections 80A may be applied to mounting of the semiconductor chip 72 with respect to other mounting sections 80A.

The embodiments described above are for facilitating the understanding of the present invention rather than for interpreting the present invention in a limiting sense. The present invention may be modified/improved without departing from its spirit, and the present invention also includes equivalents thereof. That is, any embodiment appropriately modified in design by a person skilled in the art is also included in the scope of the present invention as long as it has a feature of the present invention. For example, each element provided in each embodiment and its arrangement, material, condition, shape, size, and the like are not limited to those illustrated and can be appropriately changed. Each embodiment is illustrative. It goes without saying that partial substitutions or combinations of configurations shown in different embodiments are possible, and these are also included in the scope of the present invention as long as they include a feature of the present invention.

What is claimed is:

1. An inspection device for inspecting a plurality of substrates arranged along a first direction and a second direction, wherein the plurality of substrates comprises a central substrate located at center and treated as a mounting section of a semiconductor chip and peripheral substrates located around the central substrate and treated as a plurality of peripheral sections, the inspection device comprises:

a measurement part, measuring a reference position of the mounting section before mounting of the semiconductor chip, a reference position of the plurality of peripheral sections located around the mounting section, and a position of the semiconductor chip after mounting; and an inspection part, based on a distance between the reference position of the mounting section and the reference position of the plurality of peripheral sections measured by the measurement part and a distance between the reference position of the plurality of peripheral sections and a mounting position of the semiconductor chip after mounting of the semiconductor chip, inspecting a relative position of the semiconductor chip with respect to the mounting section.

2. The inspection device according to claim 1, wherein the measurement part measures the mounting position of the semiconductor chip based on a position of a feature point exposed on a surface opposite to a mounting surface of the semiconductor chip after mounting.

3. The inspection device according to claim 1, wherein the second direction intersecting the first direction; and the plurality of peripheral sections comprise a section adjacent to the mounting section in the first direction and a section adjacent to the mounting section in the second direction.

4. A mounting apparatus, comprising:

the inspection device according to claim 1; and a mounting part, mounting the semiconductor chip with respect to the mounting section, wherein based on an amount of deviation of the relative position of the semiconductor chip inspected by the inspection part from a target position, the mounting part corrects the mounting position of the semiconductor chip with respect to the mounting section.

5. An inspection method for inspecting a plurality of substrates arranged along a first direction and a second direction, wherein the plurality of substrates comprises a central substrate located at center and treated as a mounting section of a semiconductor chip and peripheral substrates located around the central substrate and treated as a plurality of peripheral sections, the inspection method comprises steps of:

measuring a reference position of the mounting section before mounting of the semiconductor chip;

measuring a reference position of the plurality of peripheral sections located around the mounting section;

measuring a position of the semiconductor chip after mounting; and, based on a distance between the reference position of the mounting section and the reference position of the plurality of peripheral sections and a distance between the reference position of the plurality of peripheral sections and a mounting position of the semiconductor chip after mounting of the semiconductor chip, inspecting a relative position of the semiconductor chip with respect to the mounting section.

6. A non-transitory computer readable recording medium storing a program for inspecting a plurality of substrates arranged along a first direction and a second direction, wherein the plurality of substrates comprises a central substrate located at center and treated as a mounting section of a semiconductor chip and peripheral substrates located around the central substrate and treated as a plurality of peripheral sections, the program causing a computer to execute:

processing for measuring a reference position of the mounting section before mounting of the semiconductor chip;

processing for measuring a reference position of the plurality of peripheral sections located around the mounting section;

processing for measuring a position of the semiconductor chip after mounting; and processing for, based on a distance between the reference position of the mounting section and the reference position of the plurality of peripheral sections and a distance between the reference position of the plurality of peripheral sections and a mounting position of the semiconductor chip after mounting of the semiconductor chip, inspecting a relative position of the semiconductor chip with respect to the mounting section.

* * * * *